(12) United States Patent  
Ma et al.

(10) Patent No.: US 11,770,909 B2
(45) Date of Patent: Sep. 26, 2023

(54) DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Yongda Ma, Beijing (CN); Jianbo Xian, Beijing (CN); Xueguang Hao, Beijing (CN); Chen Xu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 316 days.

(21) Appl. No.: 17/297,130

(22) PCT Filed: Jun. 24, 2020

(86) PCT No.: PCT/CN2020/098263
§ 371 (c)(1),
(2) Date: May 26, 2021

(87) PCT Pub. No.: WO2020/259628
PCT Pub. Date: Dec. 30, 2020

(65) Prior Publication Data
US 2022/0151090 A1 May 12, 2022

(30) Foreign Application Priority Data
Jun. 28, 2019 (CN) .......................... 201910576086.5

(51) Int. Cl.
H05K 5/00 (2006.01)
H05K 5/02 (2006.01)
H05K 5/03 (2006.01)

(52) U.S. Cl.
CPC ......... *H05K 5/0217* (2013.01); *H05K 5/0017* (2013.01); *H05K 5/03* (2013.01)

(58) Field of Classification Search
CPC ....... H05K 5/0217; H05K 5/0017; H05K 5/03
(Continued)

(56) References Cited

U.S. PATENT DOCUMENTS

2005/0264689 A1 12/2005 Yang et al.
2021/0200327 A1 7/2021 Ma
2021/0360805 A1* 11/2021 Wang .................. H05K 5/0217

FOREIGN PATENT DOCUMENTS

CN 106094990 11/2016
CN 106873715 6/2017
(Continued)

OTHER PUBLICATIONS

Chinese First Office Action (w/ English translation) for corresponding CN Application No. 201910576086.5. 18 pages.
(Continued)

*Primary Examiner* — Hung S. Bui
(74) *Attorney, Agent, or Firm* — Dority & Manning, P.A.

(57) ABSTRACT

A display device includes: a display panel; a housing configured to support and protect the display panel; a bracket disposed between the display panel and the housing; a plurality of sensors fixed on the bracket; a window located in the display panel or in the housing, and configured to expose at least one of the plurality of sensors; and a driver configured to control the bracket to rotate in a plane parallel to the display panel, and to control the bracket to stop rotating when a required sensor rotates to a position of the window.

19 Claims, 12 Drawing Sheets

(58) Field of Classification Search
USPC .................................... 361/807, 809, 810
See application file for complete search history.

(56) References Cited

FOREIGN PATENT DOCUMENTS

| CN | 206993221 | | 2/2018 | | |
| CN | 108333392 | | 7/2018 | | |
| CN | 108418917 | | 8/2018 | | |
| CN | 108594942 | | 9/2018 | | |
| CN | 208092591 | | 11/2018 | | |
| CN | 208094612 | | 11/2018 | | |
| CN | 208094613 | | 11/2018 | | |
| CN | 109005263 | * | 12/2018 | ............. | H04M 1/02 |
| CN | 109561179 | | 4/2019 | | |
| CN | 109683668 | | 4/2019 | | |
| CN | 109743423 | | 5/2019 | | |
| CN | 109788688 | | 5/2019 | | |
| CN | 110297522 | | 10/2019 | | |
| CN | 210518443 | * | 5/2020 | ............. | H04M 1/02 |
| CN | 111726440 | * | 9/2020 | ............. | H04M 1/02 |
| DE | 29817564 | | 12/1998 | | |
| KR | 20130067986 | * | 12/2015 | .......... | G02F 1/1333 |
| KR | 20190061226 | * | 11/2017 | ............... | H04R 7/04 |

OTHER PUBLICATIONS

Chinese Second Office Action (w/ English translation) for corresponding CN Application No. 201910576086.5. 18 pages.
Chinese Notification to Grant Patent Right for Invention (w/ English translation) for corresponding CN Application No. 201910576086.5, 7 pages.
PCT International Search Report (w/ English translation) for corresponding PCT Application No. PCT/CN2020/098263, dated Sep. 24, 2020, 5 pages.

* cited by examiner

DISPLAY DEVICE

CROSS-REFERENCE TO RELATED APPLICATIONS

This application is a national phase entry under 35 USC 371 of International Patent Application No. PCT/CN 2020/098263 filed on Jun. 24, 2020, which claims priority to Chinese Patent Application No. 201910576086.5, filed with China Patent Office on Jun. 28, 2019, which are incorporated herein by reference in their entirety.

TECHNICAL FIELD

The present disclosure relates to the field of display technologies, and in particular, to a display device.

BACKGROUND

With the development of display technologies, consumers have higher and higher requirements for display devices, and the market orientation gradually develops toward full-screen display and double-sided screen display.

SUMMARY

A display device is provided. The display device includes: a display panel; a housing configured to support and protect the display panel; a bracket disposed between the display panel and the housing; a plurality of sensors fixed on the bracket; a window located in the display panel or in the housing, and configured to expose at least one of the plurality of sensors; and a driver configured to control the bracket to rotate in a plane parallel to the display panel, and to control the bracket to stop rotating when a required sensor rotates to a position of the window.

In some embodiments, the driver includes a direct current motor and a driving rotor connected to an output shaft of the direct current motor. The direct current motor is configured to control the driving rotor to rotate in response to a user's instruction. The driving rotor is engaged with the bracket, and the driving rotor is configured to drive the bracket to rotate in the plane parallel to the display panel.

In some embodiments, the driving rotor and the bracket are provided with teeth, and the driving rotor and the bracket form a bevel gear. The driving rotor is configured to rotate in a plane perpendicular to the display panel, and the bracket is configured to rotate in the plane parallel to the display panel.

In some embodiments, the driving rotor and the bracket are provided with teeth, and the driving rotor and the bracket form a cylindrical gear. The driving rotor and the bracket are both configured to rotate in the plane parallel to the display panel.

In some embodiments, the driver further includes a transmission shaft, and a first transmission wheel and a second transmission wheel that are disposed on the transmission shaft. The first transmission wheel is engaged with the driving rotor, and the second transmission wheel is engaged with the bracket, so that a motion output by the direct current motor is transmitted to the bracket through the transmission shaft.

In some embodiments, the driver further includes an electromagnetic switch and an electromagnet connected to the electromagnetic switch. The electromagnetic switch is configured to control the electromagnet, in response to a user's instruction, so that the driving rotor is able to move towards the bracket, so as to be engaged with the bracket, and to move away from the bracket, so as to be disengaged from the bracket.

In some embodiments, the driving rotor is made of a permanent magnet.

In some embodiments, the driver includes an adjusting rod, and the housing includes an opening. An end of the adjusting rod is connected to the bracket, and another end of the adjusting rod extends out of the housing through the opening.

In some embodiments, the display device further includes a limiting structure disposed between the housing and the bracket. The limiting structure is configured to stop the bracket from rotating when the required sensor rotates to the position of the window.

In some embodiments, the bracket includes at least one limiting recess, and the at least one limiting recess is configured to be matched with the limiting structure to stop the bracket from rotating when the required sensor rotates to the position of the window.

In some embodiments, the bracket further includes at least one buffer recess that interacts with the limiting structure. A depth of the at least one buffer recess is less than a depth of the at least one limiting recess. Or, an attractive force of the at least one buffer recess directly facing the limiting structure is less than an attractive force of the at least one limiting recess directly facing the limiting structure. Or, a force of surface friction of the at least one buffer recess is less than a force of surface friction of the at least one limiting recess.

In some embodiments, the limiting structure includes at least one projection disposed on the housing.

In some embodiments, a height of the limiting structure is adjustable in a depth direction of the at least one limiting recess. The limiting structure is configured such that when the bracket rotates, an end of the limiting structure proximate to the bracket is retracted to be flush with a surface of the bracket proximate to the limiting structure, and when the bracket stops, the end of the limiting structure proximate to the bracket extends into the at least one limiting recess.

In some embodiments, the display panel includes a first display panel and a second display panel. A surface of the first display panel facing away from the second display panel is a display surface. A surface of the second display panel facing away from the first display panel is a display surface. The window is disposed in the first display panel or in the second display panel. The housing includes a frame, and the frame supports and protects the first display panel and the second display panel.

In some embodiments, the display device further includes a supporting structure, and the supporting structure supports between the first display panel and the second display panel.

In some embodiments, the housing includes a frame and a rear housing. The rear housing is arranged opposite to the display panel, and the window is disposed in the rear housing. The plurality of sensors are disposed on a surface of the bracket proximate to the rear housing.

In some embodiments, the display device further includes a supporting structure, and the supporting structure supports between the display panel and the rear housing.

In some embodiments, the display panel includes a display area and a non-display area. The window is disposed in the display area. Or the window is disposed in the non-display area.

In some embodiments, the window includes a cutout. Or, the window includes the cutout and a protective layer that is transparent or translucent and covers the cutout.

In some embodiments, the plurality of sensors include at least two of following combination: a camera, a fingerprint sensor, an optical vital sign recognition sensor, a distance sensor, a proximity light sensor or an ambient light sensor.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but not limitations on an actual size of a product, an actual process of a method and an actual timing of a signal to which the embodiments of the present disclosure relate.

DETAILED DESCRIPTION

Figure 1:
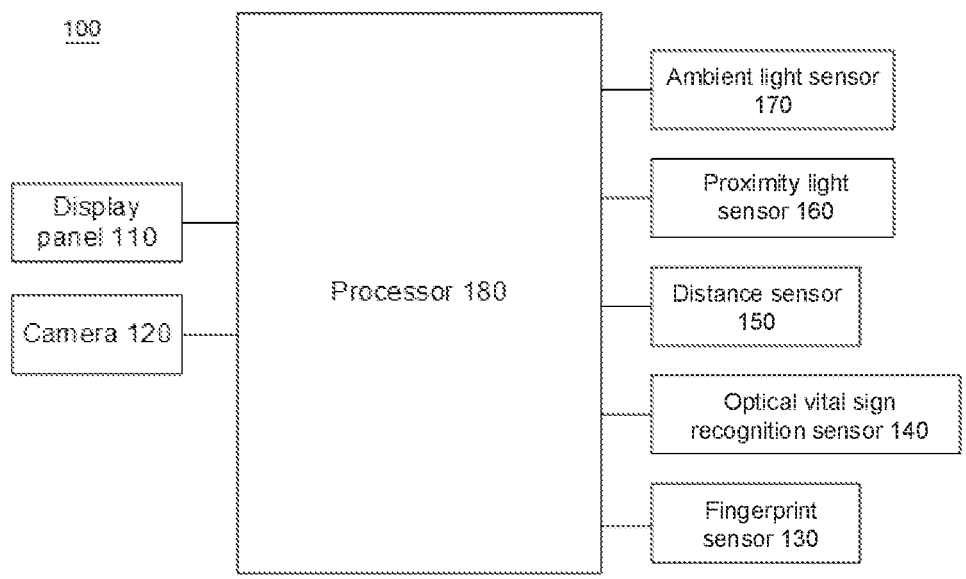
FIG. 1 is a hardware configuration diagram of a display device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to".

In the description of the specification, terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In the description of some embodiments, the term "connected" and derivatives thereof may be used. For example, the term "connected" may be used in the description of some embodiments to indicate that two or more components are in direct physical or electrical contact with each other.

Below, the terms such as "first" and "second" are only used for descriptive purposes, and are not to be construed as indicating or implying the relative importance or implicitly indicating the number of indicated technical features. Thus, a feature defined by "first" or "second" may explicitly or implicitly include one or more of the features. In the description of the embodiments of the present disclosure, the term "a/the plurality of" means two or more unless otherwise specified.

In the description of the present invention, it will be understood that orientations or positional relationships indicated by terms such as "center", "upper", "lower", "front", "rear", "left", "right", "vertical", "horizontal", "top", "bottom", "inner", and "outer" are based on orientations or positional relationships shown in the drawings, which are merely to facilitate the description of the invention and simplify the description, and are not to indicate or imply that the indicated devices or elements must have particular orientations, or must be constructed or operated in particular orientations, and thus cannot be construed as limitations on the present invention.

At present, a display device generally has other functions in addition to a display function of displaying images and videos. For example, a user's vital signs including heartbeat, blood pressure, and breath are monitored through the display device. A user's walking steps or riding distances are monitored through the display device. The display device may sense changes in a brightness of ambient light, and adjust a brightness of its own screen to adapt to the brightness of the ambient light, so as to avoid harming a user's eyesight. The display device may collect a user's fingerprints to realize identity verification of the user. The display device may measure a distance, for example, measure a depth of a house. The display device may also determine whether there is an object near the display device, so as to remind a blind user, or to remind a user to avoid bruising under a condition of poor light at night.

Some embodiments of the present disclosure provide a display device. The display device includes a display panel, a plurality of sensors, and a processor. The plurality of sensors may implement the plurality of functions described above. The plurality of sensors include at least two sensors. For example, the display device may be a handheld display device, such as a mobile phone, a tablet computer, a wearable device, or a personal digital assistant, and may also be a display device that is not required to be handheld, such as a notebook computer, a desktop computer, a television, or a digital photo frame.

FIG. 1 shows a schematic configuration diagram of the display device 100. The display device 100 includes the display panel 110, a camera 120, a fingerprint sensor 130, an optical vital sign recognition sensor 140, a distance sensor 150, a proximity light sensor 160, an ambient light sensor 170, and the processor 180.

It can be understood that, the configuration shown in FIG. 1 does not constitute a limitation on the display device 100. In some embodiments of the present disclosure, the display device 100 may include more or less components than those shown in FIG. 1, or may combine certain components or disassemble certain components.

The display panel 110 is used for displaying images, videos, etc. The display panel may use a liquid crystal display (LCD) display panel, an organic light-emitting diode (OLED) display panel, an active-matrix organic light-emitting diode (AMOLED) display panel, a flexible light-emitting diode (FLED) display panel, a quantum dot light-emitting diode (OLED) display panel or other display panels. In some embodiments, the display panel 110 may also be a double-sided display panel that includes two display panels, such as a combination of a color display panel and an electronic paper display panel. The color display panel may be any one of the aforementioned display panels. Or, the two display panels of the double-sided display panel are both color display panels, and the color display panel may be any one of the aforementioned display panels.

The camera 120 is used for capturing still images or shooting videos. For an object, an optical image thereof is generated through a lens of the camera 120, and the optical image is projected to a photosensitive element. The photosensitive element may be a charge-coupled device (CCD) or a complementary metal oxide semiconductor (CMOS) phototransistor. The photosensitive element converts light signals into electrical signals, and then transmits the electrical signals to an image signal processor (ISP) to convert the electrical signals into digital image signals. The ISP outputs the digital image signals to a digital signal processor (DSP) for processing, and the DSP converts the digital image signals into image signals of standard RGB, YUV or other formats. An RGB camera, an infrared camera, a depth camera or other cameras may be used as the camera.

The fingerprint sensor 130 is used for collecting fingerprints. The display device utilizes collected fingerprint features to realize fingerprint unlocking, application lock access, fingerprint photographing, etc. The fingerprint sensor 130 may be an optical fingerprint sensor, a capacitive fingerprint sensor, an ultrasonic fingerprint sensor, or the like.

The optical vital sign recognition sensor 140 is used for monitoring a user's vital signs including heartbeat, blood pressure, and breath, and may also be used for monitoring a user's walking steps or riding distances.

The distance sensor 150 is used for measuring a distance, for example, measuring a depth of a house. The distance sensor 150 may measure the distance by infrared or laser.

The proximity light sensor 160 may include, for example, a light-emitting diode (LED) and a photodetector such as a photodiode. The light-emitting diode may be an infrared light-emitting diode. The display device emits infrared light to the outside through the light-emitting diode, and detects reflected infrared light from a nearby object using the photodiode. When sufficient reflected light is detected, it may be determined that there is an object near the display device. When insufficient reflected light is detected, the display device may determine that there is no object near the display device.

The ambient light sensor 170 is used for sensing a brightness of the ambient light. The display device may adaptively adjust a brightness of the display panel according to the sensed brightness of the ambient light, so as to avoid harming a user's eyesight. The ambient light sensor may also be used to automatically adjust the white balance when photographing is performed.

The processor 180 may include one or more processing units. For example, the processor may include a controller, a memory, a graphics processing unit (GPU), the ISP, a video codec, and the DSP. The memory may include a random access memory (RAM), a flash memory, a read-only memory (ROM), an erasable programmable ROM (EPROM), an electrically EPROM (EEPROM), or a register.

Sensors, such as the camera 120, the fingerprint sensor 130, the optical vital sign recognition sensor 140, the distance sensor 150, the proximity light sensor 160 and the ambient light sensor 170, are required to be in direct contact with a user's finger or required not to be blocked by other objects when implementing their corresponding functions, which requires that more windows or a large window is provided in the display panel to expose these sensors.

However, in the current development trend of display devices, full screens are becoming more and more prevalent, which requires an area of a display area of a display panel to be larger and larger and an area of a non-display area to be smaller and smaller. The aforementioned plurality of sensors are generally provided in the non-display area.

Figure 2A:
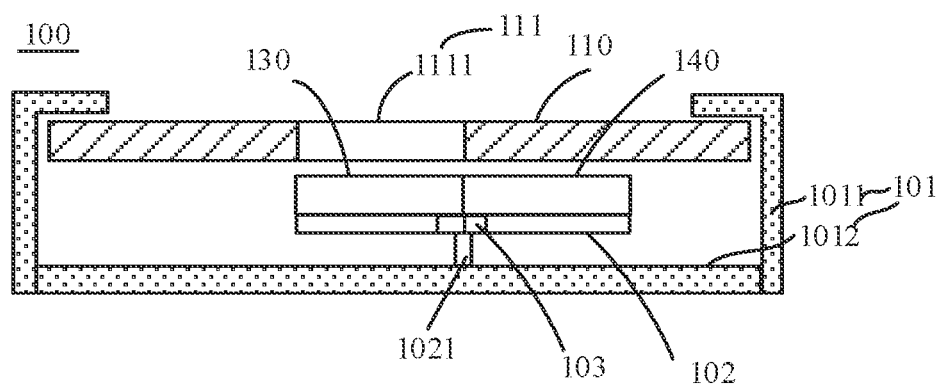
FIGS. 2A to 2G are sectional views of a display device, in accordance with some embodiments of the present disclosure.
Figure 2B:
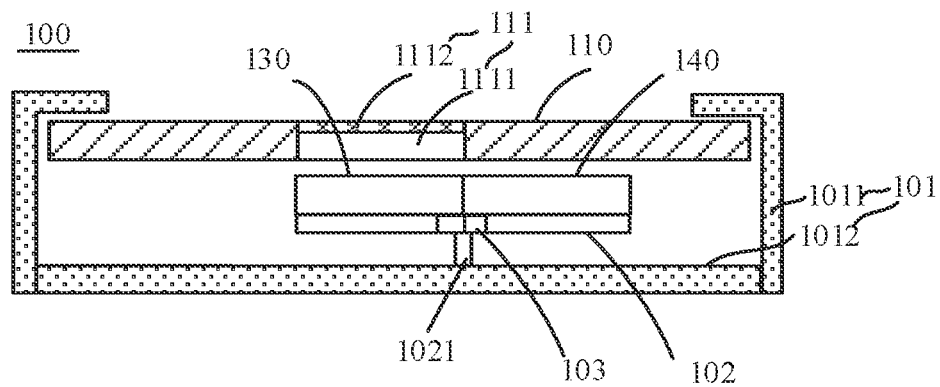

On this basis, as shown in FIGS. 2A and 2B, in some embodiments of the present disclosure, the display device 100 further includes a housing 101. The display panel 110 is located in the housing 101, and the housing 101 supports and protects the display panel 110. The display device 100 further includes a bracket 102 and a shaft 1021. The bracket 102 is located between the housing 101 and the display panel 110, and is configured to fix and support the aforementioned plurality of sensors. For example, an end of the shaft 1021 is fixed in the housing 101, and another end is disposed in the bracket 102 through a bearing, so that the bracket 102 is able to rotate relative to the shaft 1021. In some embodiments of the present disclosure, the aforementioned plurality of sensors include at least two of the following combination: the camera 120, the fingerprint sensor 130, the optical vital sign recognition sensor 140, the distance sensor 150, the proximity light sensor 160, or the ambient light sensor 170.

As an example, FIGS. 2A and 2B only show the fingerprint sensor 130 and the optical vital sign recognition sensor 140.

The display panel 110 includes a window 111, and a size of the window 111 is less than a size required to expose the plurality of sensors. For example, the size of the window 111 may be set in a way that the window 111 exposes only one sensor. For another example, in a case where the number of the plurality of sensors is more than two, the size of the window 111 may be set in a way that the window 111 exposes only one or two sensors. For yet another example, in a case where the number of the plurality of sensors is more than three, the size of the window 111 may be set in a way that the window 111 exposes only one or two or three sensors. In this way, when a user needs to use a certain sensor, the bracket 102 may be driven to rotate, so that the sensor is exposed through the window 111. To this end, the display device 100 further includes a driver 103. The driver 103 is connected to the bracket 102, so as to drive the bracket 102 to rotate.

In some embodiments, as shown in FIG. 2A, the window 111 includes a cutout 1111 formed by removing a material in the display panel 110. In some embodiments, as shown in FIG. 2B, the window 111 includes the cutout 1111 formed by removing the material in the display panel 110, and a protective layer 1112 that is transparent or translucent and covers the cutout. The protective layer 1112 that is transparent or translucent may be made of plastic, resin, or glass. The protective layer that is transparent or translucent may protect the aforementioned plurality of sensors from being in direct contact with oxygen and moisture, so as to prevent oxygen or moisture from affecting service lives of the plurality of sensors.

It will be noted that, the window 111 is not limited to being disposed in the display panel 110, but may also be located in the housing 101.

In the display device provided by some embodiments of the present disclosure, the driver 103 controls the bracket 102 to rotate around the shaft 1021 in a plane parallel to the display panel 110, so as to drive the plurality of sensors fixed on the bracket 102 to rotate around the shaft 1021 in the plane parallel to the display panel 110. When the sensor required for a user rotates to the window, the bracket 102 stops rotating. In this way, only one window 111 is required to be provided in the display device, so that the plurality of sensors may be sequentially exposed through the window 111, so as to work normally. Moreover, the number of the windows 111 and the size of the window 111 are reduced, thereby reducing an area occupied by the window in the display device. In particular, for a full-screen display device, it is possible to greatly increase an area of a display area and improve a screen-to-body ratio. The plane parallel to the display panel 110 refers to a plane parallel to a plane where a display area of the display panel 110 is located.

In some embodiments of the present disclosure, as shown in FIGS. 2A and 2B, the housing 101 includes a frame 1011 and a rear housing 1012, and the display panel 110 is located in a space enclosed by the frame 1011 and the rear housing 1012. In this case, the window 111 may also be located in the frame 1011 or in the rear housing 1012.

Figure 2C:
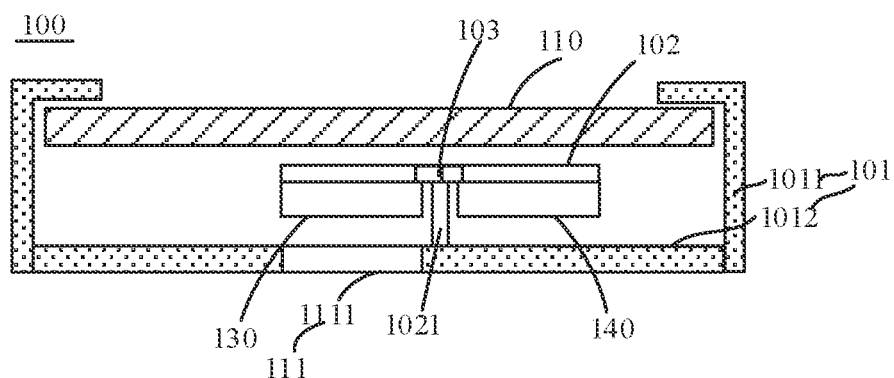

In some embodiments of the present disclosure, as shown in FIG. 2C, the window 111 may be disposed in the rear housing 1012. In this case, the plurality of sensors are disposed on a surface of the bracket 102 proximate to the rear housing 1012. The bracket 102 rotates, so that the plurality of sensors are sequentially exposed through the window 111.

Figure 2D:
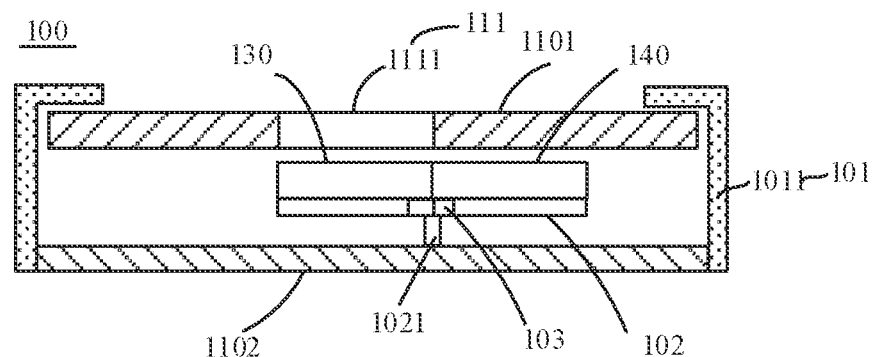
Figure 2E:
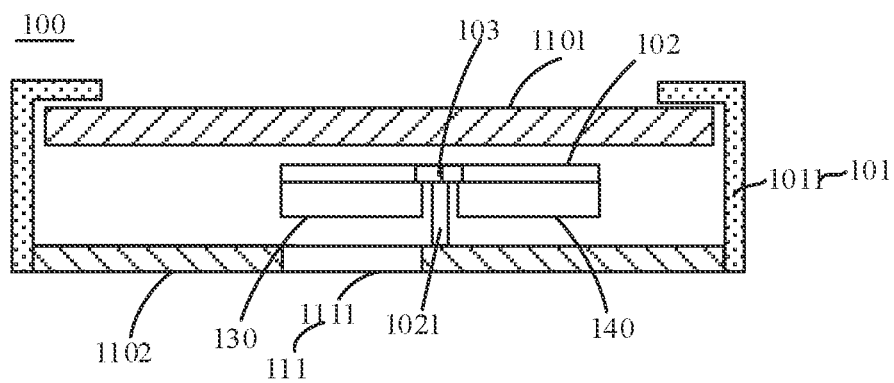
Figure 2F:
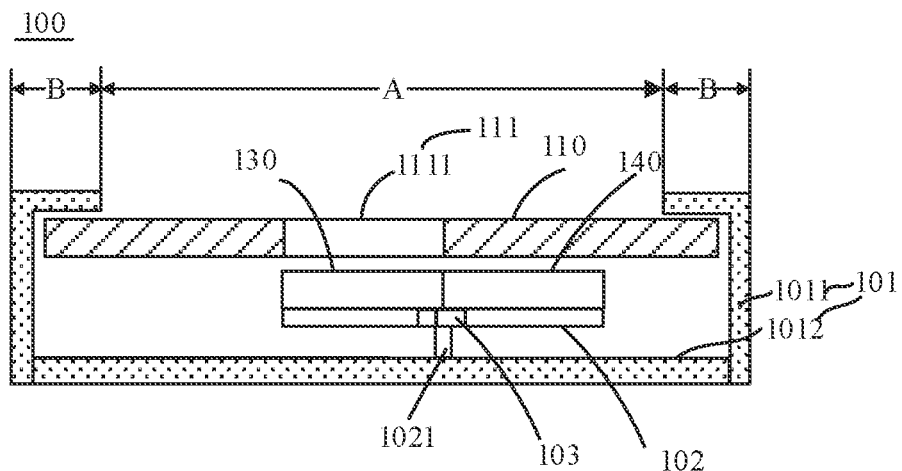
Figure 2G:
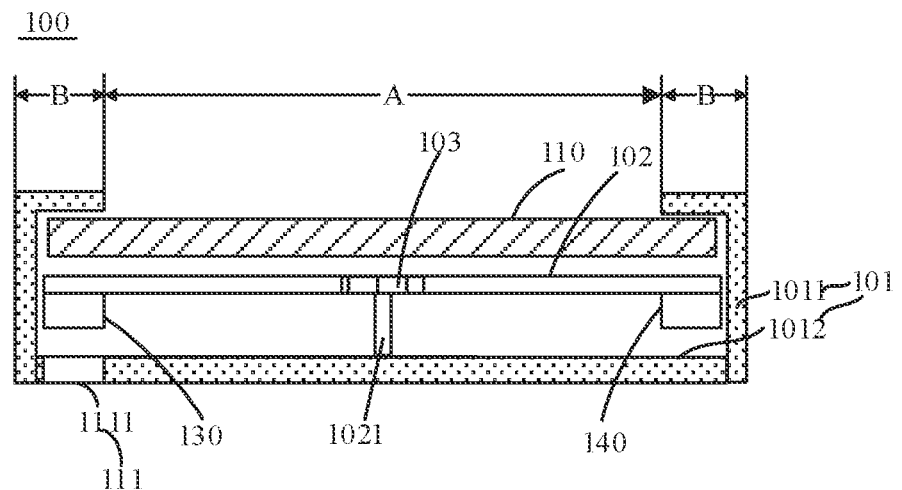

In some embodiments of the present disclosure, as shown in FIGS. 2F and 2G, the display panel 110 includes the display area A and a non-display area B located in at least one side of the display area. The window 111 may be disposed in the display area of the display panel 110 (as shown in FIG. 2F), and may also be disposed in the non-display area of the display panel 110 (as shown in FIG. 2G). A depth direction of the window 111 is the same as a thickness direction of the display panel 110.

For the double-sided display panel including two display panels, as shown in FIGS. 2D and 2E, the display panel 110 includes a first display panel 1101 and a second display panel 1102. For example, the first display panel is the color display panel, and the second display panel is the electronic paper display panel. In this case, as shown in FIG. 2D, the rear housing 1012 may be omitted, and the second display panel is used as the rear housing 1012. The bracket 102 is disposed between the first display panel and the second display panel. Moreover, in this case, as shown in FIG. 2E, the window 111 may also be located in the second display panel. A display side of the first display panel is a side of the first display panel facing away from the second display panel, and a display side of the second display panel is a side of the second display panel facing away from the first display panel.

Figure 3:
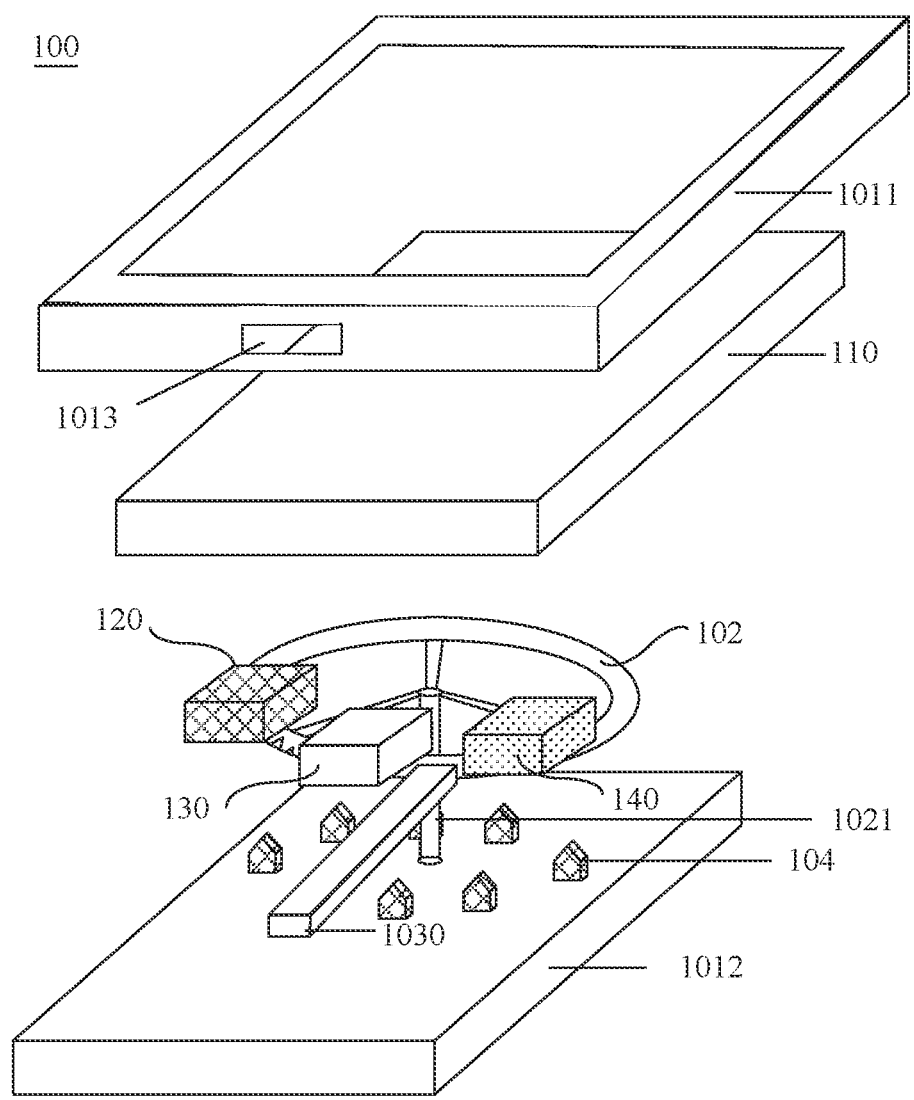
FIG. 3 is an exploded view of a display device, in accordance with some embodiments of the present disclosure.
Figure 4:
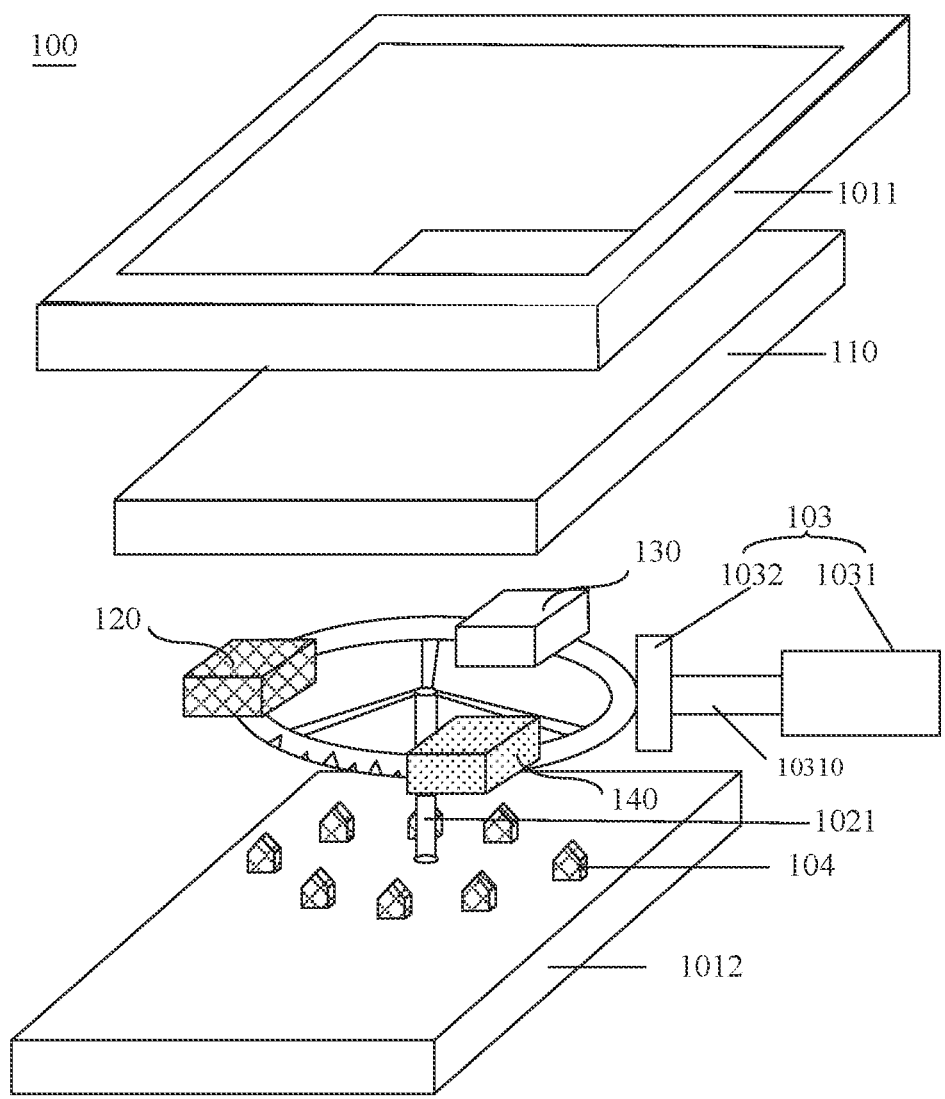
FIG. 4 is an exploded view of another display device, in accordance with some embodiments of the present disclosure.

In some embodiments of the present disclosure, as shown in FIGS. 3 and 4, the bracket 102 is in a shape of a circle, and the plurality of sensors are distributed on the bracket 102 at intervals along an outer edge of the circle. The plurality of sensors are fixed on a surface of the bracket 102 proximate to the display panel 110. The bracket 102 rotates, so that one of the plurality of sensors is exposed through the window 111. In some embodiments of the present disclosure, the window 111 is large, and the bracket 102 rotates, so that two or more of the plurality of sensors are exposed through the window 111. As an example, FIGS. 3 and 4 only show the camera 120, the fingerprint sensor 130 and the optical vital sign recognition sensor 140. It will be noted that, in some embodiments, the bracket 102 may be in a shape of a portion of a circle, such as in a fan shape. In this case, the plurality of sensors may be distributed on the bracket 102 at intervals along an outer edge of the fan shape. For example, in FIG. 3, the bracket 102 is in the shape of the circle. However, in order to sequentially expose all the sensors on the bracket 102 in a case where the bracket 102 is at a small rotation angle, the sensors on the bracket 102 are arranged closely, so that the plurality of sensors are arranged on the circular bracket at intervals along the outer edge of the fan shape. In some embodiments, an angle corresponding to the fan shape formed by an arrangement of the plurality of sensors is less than 180°, for example, 150°, 120°, 90°, 60°, 30°, or 15°.

In some embodiments of the present disclosure, as shown in FIG. 3, the driver 103 includes an adjusting rod 1030. An end of the adjusting rod 1030 is connected to the bracket 102, and another end may be touched by a user. The frame 1011 includes an opening 1013, and the adjusting rod 1030 extends out through the opening 1013, so that the adjusting rod 1030 may be touched by the user. The user may manually drive the adjusting rod 1030 to rotate the bracket 201 around the shaft 1021. In some embodiments of the present disclosure, the end of the adjusting rod 1030 may be hinged to the bracket 102. In a case where the bracket 102 is not required to rotate, the user may drive the adjusting rod 1030, so that the adjusting rod 1030 retracts towards the display device 100, which avoids affecting an appearance of the display device. For example, the end of the adjusting rod 1030 connected to the bracket 102 may rotate from a front-rear direction shown in FIG. 3 (i.e., a direction perpendicular to the paper surface) to a left-right direction shown in FIG. 3, thereby retracting towards the display device 100.

Figure 5A:
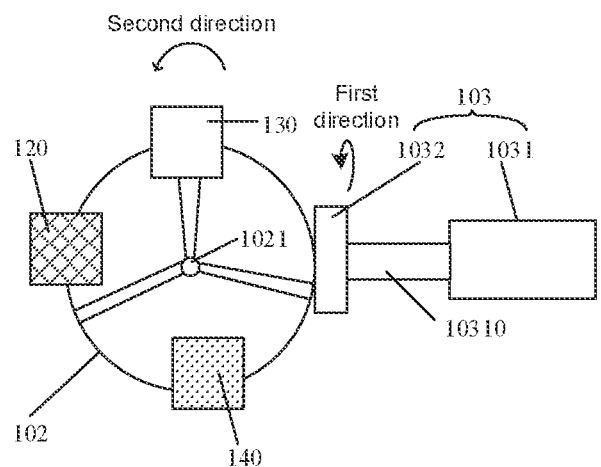
FIG. 5A is a diagram showing a relationship between a bracket and a driver, in accordance with some embodiments of the present disclosure.

In some embodiments of the present disclosure, a driver 103 for making the bracket 102 automatically rotate is provided, so as to make the operation and use of the display device simple and easy. The driver 103 includes a direct current motor 1031 and a driving rotor 1032. As shown in FIG. 5A, an output shaft 10310 of the direct current motor 1031 is perpendicular to the shaft 1021, and the driving rotor 1032 cooperates with the bracket 102 to transmit a rotary motion output by the direct current motor 1031 to the bracket 102. In some embodiments, both the driving rotor 1032 and the bracket 102 are provided with teeth, and the driving rotor 1032 and the bracket 102 form a bevel gear, so that the driving rotor 1032 is engaged with the bracket 102. The direct current motor 1031 receives a user's instruction, and controls the driving rotor 1032 to rotate in a plane perpendicular to the display panel, for example, to rotate in a first direction (perpendicular to the paper surface outward) shown in FIG. 5A, thereby driving the bracket 102 to rotate in the plane parallel to the display panel, for example, to rotate in a second direction (to rotate in an anticlockwise direction in the paper surface) shown in FIG. 5. The plane perpendicular to the display panel refers to a plane perpendicular to the plane where the display surface of the display panel is located.

Figure 5B:
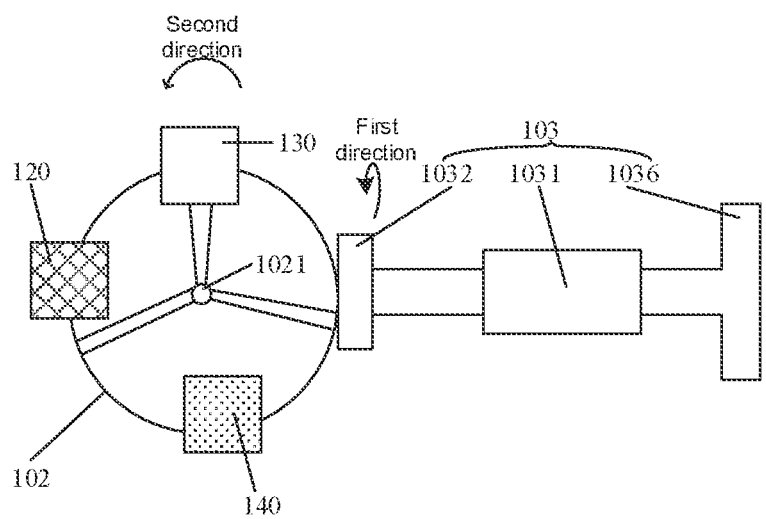
FIG. 5B is a diagram showing another relationship between a bracket and a driver, in accordance with some embodiments of the present disclosure.

As shown in FIG. 5B, in some embodiments of the present disclosure, in a case where the display device is a mobile phone, the direct current motor 1031 may be an eccentric motor having a vibration function in the mobile phone. In this case, the output shaft 10310 of the direct current motor is further provided with an eccentric rotor 1036. In this way, when the direct current motor 1031 rotates to drive the bracket 102 to rotate, the mobile phone also vibrates, thereby reminding a user that the sensor is being switched. However, if the user does not want the mobile phone to vibrate when the sensor is switched, the direct current motor 1031 may rotate in a reverse direction, so that the output shaft of the direct current motor 1031 drives only the driving rotor 1032 to rotate without driving the eccentric rotor 1036 to rotate.

Figure 6A:
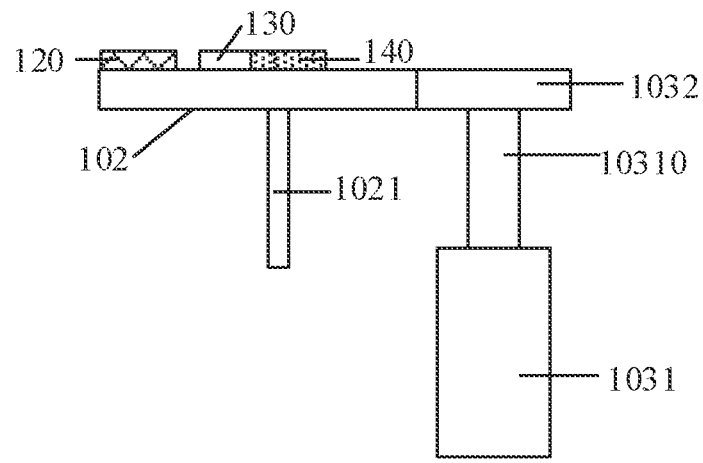
FIG. 6A is a diagram showing a relationship between a bracket and a driver, in accordance with some embodiments of the present disclosure.
Figure 6B:
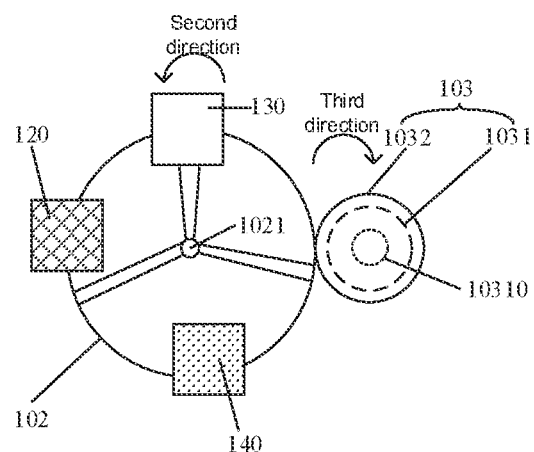
FIG. 6B is a top view of FIG. 6A.

In some embodiments of the present disclosure, as shown in FIGS. 6A and 6B, the output shaft 10310 of the direct current motor 1031 is parallel to the shaft 1021, and the driving rotor 1032 cooperates with the bracket 102 to transmit the rotary motion output by the direct current motor 1031 to the bracket 102. In some embodiments, both the driving rotor 1032 and the bracket 102 are provided with teeth, and the driving rotor 1032 and the bracket 102 form a cylindrical gear, so that the driving rotor 1032 is engaged with the bracket 102. The direct current motor 1031 receives a user's instruction, and controls the driving rotor 1032 to rotate in the plane parallel to the display panel, thereby driving the bracket to rotate in the plane parallel to the display panel. For example, the bracket rotates in the second direction (rotates in the anticlockwise direction) as shown in FIG. 6B, and the driving rotor 1032 rotates in a third direction (rotates in a clockwise direction) as shown in FIG. 6B, but both the bracket and the driving rotor 1032 rotate in the plane parallel to the display panel.

In a case where the display device is thick, there is enough space between the display panel and the housing. The arrangement that the output shaft 10310 of the direct current motor 1031 is in parallel to the shaft 1021 may be used. In a case where the display device is thin, the arrangement that the output shaft 10310 of the direct current motor 1031 is perpendicular to the shaft 1021 is used, so as to save the space between the display panel and the housing. A thickness of the display device as shown in FIG. 5A is generally less than a thickness of the display device as shown in FIG. 6A.

Figure 7A:
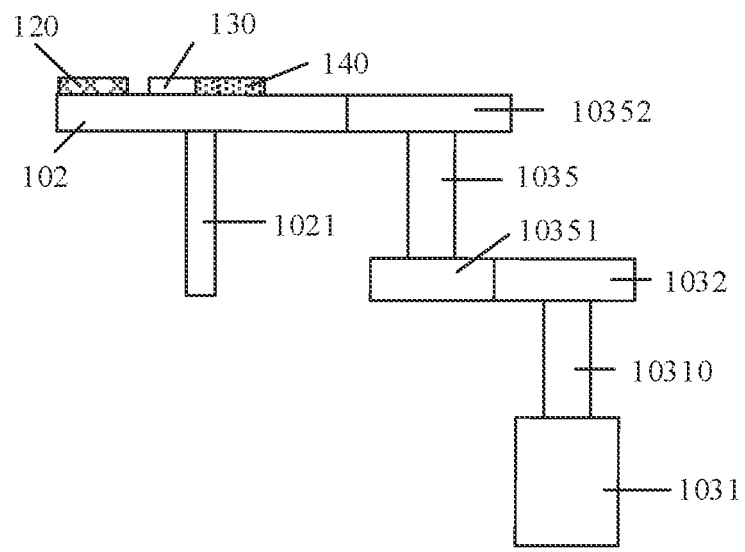
FIG. 7A is a diagram showing a relationship between a bracket and a driver, in accordance with some embodiments of the present disclosure.
Figure 7B:
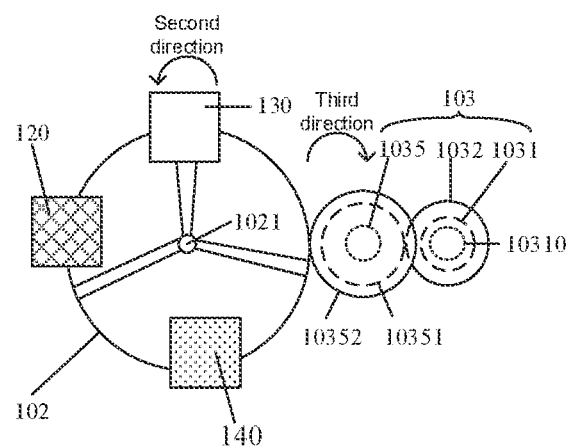
FIG. 7B is a top view of FIG. 7A.

In some embodiments of the present disclosure, in order to avoid a fast rotation speed of the bracket, as shown in FIGS. 7A and 7B, the driver 103 further includes a transmission shaft 1035. A first transmission wheel 10351 on the transmission shaft 1035 is engaged with the driving rotor 1032, and a second transmission wheel 10352 on the transmission shaft 1035 is engaged with the bracket 102. The direct current motor 1031 receives the user's instruction, and controls the driving rotor 1032 to rotate, and the driving rotor 1032 drives the transmission shaft 1035 to rotate, so as to rotate the bracket 102. The first transmission wheel 10351 and the second transmission wheel 10352 may be used for changing a transmission ratio of the driver 103.

Figure 9:
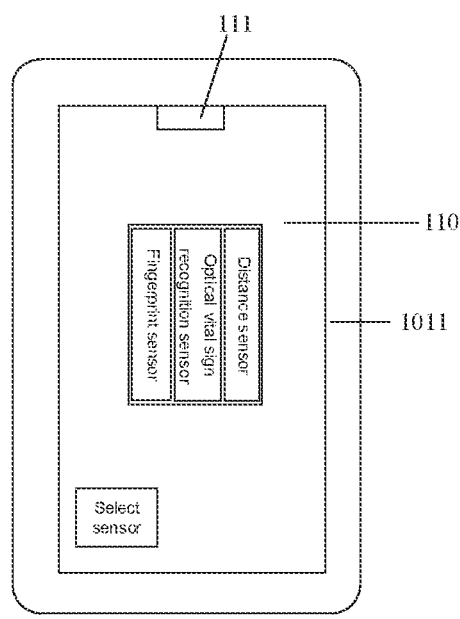
FIG. 9 is a schematic diagram showing an operation effect of a display device, in accordance with some embodiments of the present disclosure.

As shown in FIG. 9, when a user needs to use any one of the plurality of sensors, the user may trigger a pushbutton for selecting a sensor on the display panel 110. For example, the user clicks "Select sensor" on the display panel 110. The display device 100 detects the user's operation, and the display panel 110 displays a selection interface. The selection interface includes options corresponding to the plurality of sensors. For example, the options shown in FIG. 9 include "Fingerprint sensor", "Optical vital sign recognition sensor", and "Distance sensor". After the user selects an option corresponding to the required sensor, the direct current motor 1031 receives the user's instruction, and controls the driving rotor 1032 to rotate, thereby driving the bracket 102 to rotate around the shaft 1021 in the plane parallel to the display panel. For example, if the display device 100 detects an operation of the user clicking "Fingerprint sensor", it controls the driver 103 to drive the bracket 102 to rotate, so that the fingerprint sensor 130 rotates to the position of the window 111. If the display device 100 detects an operation of the user clicking "Optical vital sign recognition sensor", it controls the driver 103 to drive the bracket 102 to rotate, so that the optical vital sign recognition sensor 140 rotates to the position of the window 111. If the display device 100 detects an operation of the user clicking "Distance sensor", it controls the driver 103 to drive the bracket 102 to rotate, so that the distance sensor 150 rotates to the position of the window 111.

Figure 10:
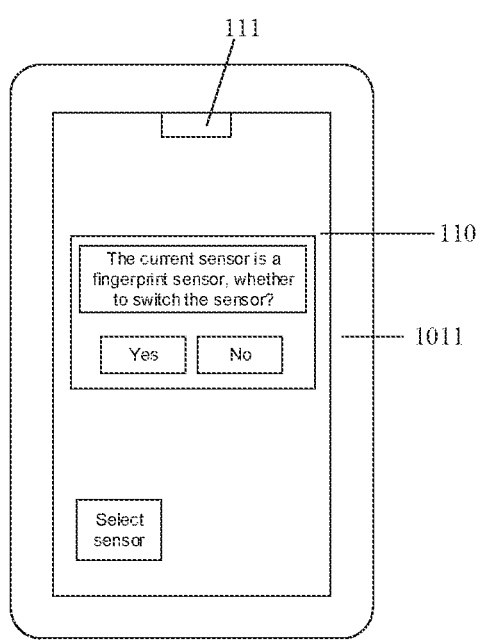
FIG. 10 is a schematic diagram showing another operation effect of a display device, in accordance with some embodiments of the present disclosure.

Or, in some embodiments, as shown in FIG. 10, the display device 100 detects an operation of the user clicking "Select sensor" on the display panel 110, and the display panel 110 displays a prompt message "The current sensor is a fingerprint sensor, whether to switch the sensor?". If the display device detects an operation of the user clicking "Yes", the display panel 110 displays a selection interface. The selection interface includes options corresponding to the plurality of sensors. If the user selects a certain option, the sensor is switched. If the display device detects an operation of the user clicking "No", the sensor is not switched.

Figure 8A:
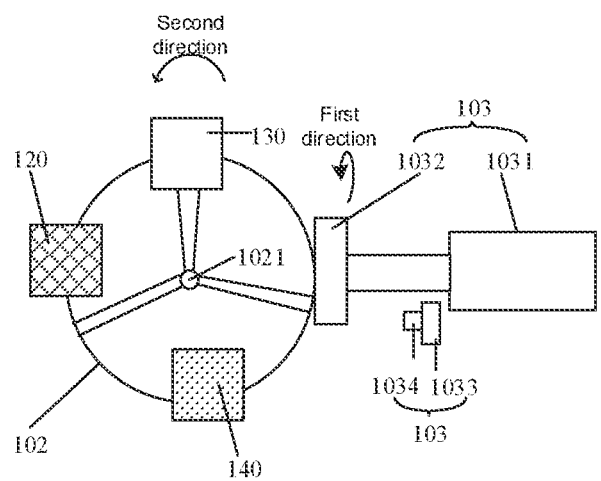
FIG. 8A is a diagram showing a relationship between a bracket and a driver, in accordance with some embodiments of the present disclosure.

In order to facilitate the maintenance and the replacement of the sensors, as shown in FIG. 8A, the driver 103 further includes an electromagnetic switch 1033 and an electromagnet 1034. The electromagnet 1034 is disposed at a side of the direct current motor 1031 proximate to the driving rotor 1032. The electromagnetic switch 1033 receives a first user's instruction, and controls a current direction in a loop of the electromagnet 1034, so that an attractive force is generated between the electromagnet 1034 and the driving rotor 1032, thereby controlling the driving rotor 1032 to move away from the bracket 102 along the output shaft 10310 of the direct current motor 1031. For example, in FIG. 8A, the driving rotor 1032 moves rightward, so that the driving rotor 1032 is disengaged from the bracket 102, thereby facilitating the disassembly and the maintenance of the bracket 102. When the driving rotor 1032 is required to be engaged with the bracket 102, the electromagnetic switch 1033 changes the current direction in the loop of the electromagnet 1034 in response to a received user's second instruction, so that a repulsive force is generated between the electromagnet 1034 and the driving rotor 1032, thereby controlling the driving rotor 1032 to move along the output shaft 10310 of the direct current motor 1031 towards the bracket 102. For example, in FIG. 8A, the driving rotor 1032 moves to the left, so that the driving rotor 1032 is engaged with the bracket 102 and the driving rotor 1032 rotates along with the output shaft 10310 of the direct current motor 1031 and drive the bracket 102 to rotate.

Figure 8B:
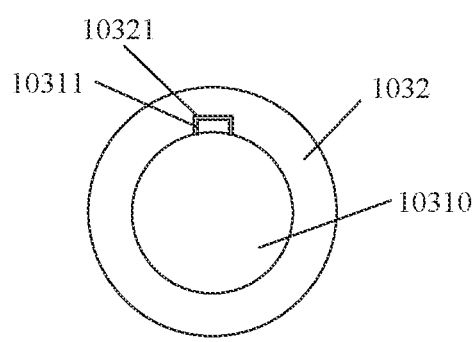
FIG. 8B is a diagram showing a fitting relationship between a driving rotor and an output shaft of a direct current motor in a display device, in accordance with some embodiments of the present disclosure.

As shown in FIG. 8B, in order to enable the driving rotor 1032 to not only rotate with the output shaft 10310 of the direct current motor 1031, but also move relative to the output shaft 10310 of the direct current motor 1031, a groove 10321 (or a protrusion) may be disposed in an inner wall of the driving rotor 1032, and a protrusion 10311 (or a groove) may be disposed on an outer wall of the output shaft 10310 of the direct current motor 1031, so that the driving rotor 1032 and the output shaft 10310 of the direct current motor 1031 are able to realize the aforementioned motions after the groove 10321 is matched with the protrusion 10311.

The driving rotor 1032 may be made of a permanent magnet. An end of the driving rotor 1032 proximate to the electromagnet 1034 is an N pole, and an end of the driving rotor 1032 away from the electromagnet 1034 is an S pole. Or conversely, the end of the driving rotor 1032 proximate to the electromagnet 1034 is the S pole, and the end of the driving rotor 1032 away from the electromagnet 1034 is the N pole. When the electromagnetic switch 1033 is turned on, the electromagnet 1034 generates magnetism by electromagnetic induction, and attracts the driving rotor 1032 to move the driving rotor 1032 towards the electromagnet 1034, or repels the driving rotor 1032 to move the driving rotor 1032 away from the electromagnet 1034. This is related to an electromagnetic field generated by the electromagnet 1034 and whether the end of the driving rotor 1032 proximate to the electromagnet 1034 is the N pole or S pole. A flow direction of the current in the loop of the electromagnet 1034 may be changed, so as to change the force applied to the driving rotor 1032 by the electromagnet 1034. For example, the attractive force is changed to the repulsive force, or the repulsive force is changed to the attractive force.

If before the direct current motor 1031 receives the user's instruction, the sensor arranged opposite to the window 111 is a sensor corresponding to the user's instruction, after the direct current motor 1031 receives the user's instruction, it is not required to control the bracket 102 to rotate.

In some embodiments of the present disclosure, as shown in FIGS. 3 and 4, the display device further includes a limiting structure 104. The limiting structure 104 is disposed between the bracket 102 and the rear housing 1012 of the housing 101, and is configured to stop the bracket 102 from rotating when one of the plurality of sensors rotates to the position of the window 111. The limiting structure 104 includes at least one projection. An end of the projection is fixed on a surface of the rear housing 1012 proximate to the display panel 110, and the other end thereof abuts against the bracket 102. Due to a friction force of the projection on the bracket 102, the bracket 102 stops rotating when the sensor required for the user rotates to the position of the window 111. A shape of the limiting structure 104 is not limited, as long as the limiting structure 104 is able to stop the bracket 102 from rotating. For example, in FIGS. 3 and 4, a shape of a top end of the projection proximate to the bracket 102 in a plane parallel to the paper surface is a triangle, but it is not limited thereto, and may also be a rectangle, a trapezoid, etc.

Figure 11:
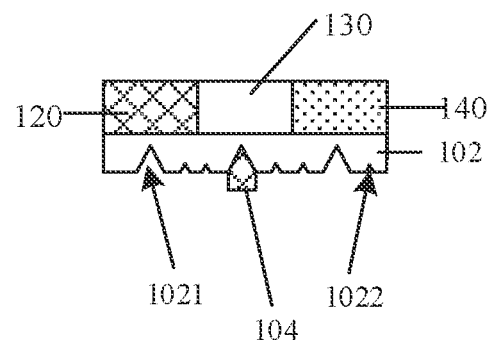
FIG. 11 is an equivalent schematic diagram showing that the bracket shown in FIG. 3 or 4 is deployed to be on a straight line.
Figure 12:
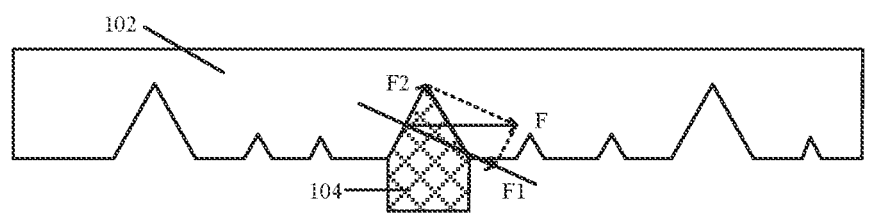
FIG. 12 is a force analysis diagram when the bracket shown in FIG. 11 moves.

In some embodiments of the present disclosure, as shown in FIG. 11, the bracket 102 includes at least one limiting recess 1021. The at least one limiting recess 1021 is located in a surface of the bracket 102 away from the display panel 110, and the at least one limiting recess 1021 is matched with the limiting structure 104 to stop the bracket 102 from rotating. FIG. 11 is an equivalent schematic diagram showing that the bracket 102 shown in FIG. 3 or 4 is deployed to be on a straight line. In some embodiments of the present disclosure, as shown in FIG. 11, an end of the limiting structure 104 that abuts against the bracket 102 is able to be embedded in the limiting recess 1021, so as to stop the bracket 102 from rotating. As shown in FIG. 12, in an example in which the bracket 102 rotates anticlockwise (perpendicular to the paper surface in FIG. 12) and stops, after the bracket is deployed to be on a straight line, the bracket 102 rotating anticlockwise and stopping is equivalent to that the bracket moves rightward and stops in FIG. 12. The display device 100 controls the driver 103 to apply a horizontal rightward force F to the bracket 102, and the bracket 102 applies the same horizontal rightward force F to the limiting structure 104. On a stress surface of the limiting structure 104, the force F is resolved into a force F1 and a force F2 in two directions perpendicular to each other. The force F1 is perpendicular to the stress surface of the limiting structure 104, and cannot disengage the bracket 102 from the limiting structure 104. The force F2 is parallel to the stress surface of the limiting structure 104, and is able to disengage the bracket 102 from the limiting structure 104 and move the bracket 102 rightward. When the required sensor rotates to the position of the window 111, the force applied by the driver 103 to the bracket 102 is removed, and the limiting structure 104 is matched with corresponding limiting recess(s) 1021, so that the bracket 102 stops moving without an action of the force F.

In some embodiments of the present disclosure, a magnetic attraction is present between the limiting recess 1021 and the limiting structure 104, and the top end of the projection proximate to the bracket 102 may be attracted in the limiting recess 1021 to stop the bracket 102 from rotating. In some embodiments of the present disclosure, the stress surface of the limiting structure 104 has a certain roughness, so that a force of surface friction applied to the limiting recess 1021 is sufficient to stop the rotating bracket 102 from rotating.

In some embodiments of the present disclosure, as shown in FIG. 11, the surface of the bracket 102 away from the display panel 110 is further provided with at least one buffer recess 1022. The at least one buffer recess 1022 is configured to interact with the limiting structure 104 to buffer the rotation of the bracket 102. A depth of the buffer recess 1022 is less than a depth of the limiting recess 1021. Or, a magnetic attraction is present both between the limiting recess 1021 and the limiting structure 104, and between the buffer recess 1022 and the limiting structure 104, and an attractive force of the limiting recess 1021 directly facing the limiting structure 104 is greater than an attractive force of the buffer recess 1022 directly facing the limiting structure 104. Or, a force of surface friction of the limiting recess 1021 is greater than a force of surface friction of the buffer recess 1022, so that a limiting effect of the buffer recess 1022 on the bracket 102 is less than a limiting effect of the limiting recess 1021 on the bracket 102.

For this purpose, in some embodiments of the present disclosure, the depth of the buffer recess 1022 may be less than the depth of the limiting recess 1021, and the attractive force of the limiting recess 1021 directly facing the limiting structure 104 is greater than the attractive force of the buffer recess 1022 directly facing the limiting structure 104. Or, the depth of the buffer recess 1022 is less than the depth of the limiting recess 1021, and the force of surface friction of the limiting recess 1021 is greater than the force of surface friction of the buffer recess 1022. Or, the depth of the buffer recess 1022 is less than the depth of the limiting recess 1021, the attractive force of the limiting recess 1021 directly facing the limiting structure 104 is greater than the attractive force of the buffer recess 1022 directly facing the limiting structure 104, and the force of surface friction of the limiting recess 1021 is greater than the force of surface friction of the buffer recess 1022.

Figure 13:
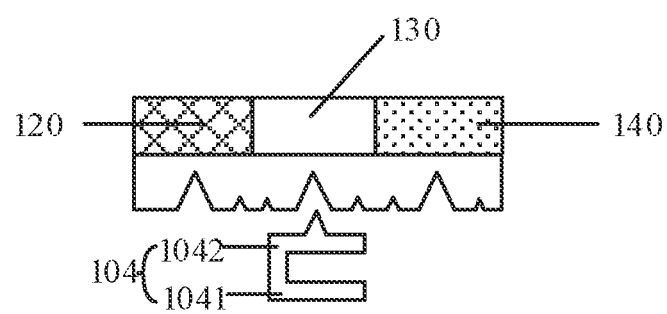
FIG. 13 is a diagram showing a relationship between a limiting structure and a bracket, in accordance with FIG. 11.

In some embodiments of the present disclosure, a height of the limiting structure 104 is adjustable in a depth direction of the limiting recess 1021 (i.e., a vertical direction shown in FIG. 11). If the limiting structure 104 is used to stop the bracket 102 from rotating, in the depth direction of the limiting recess 1021, the limiting structure 104 extends until it extends into the limiting recess 1021, so as to fix the bracket 102. Otherwise, a surface of the limiting structure 104 proximate to the bracket 102 is retracted to be flush with a top surface of the limiting recess 1021 (i.e., a lower surface of the bracket 102 shown in FIG. 11), so as to prevent the limiting structure 104 from affecting the rotation of the bracket 102 during a rotation process of the bracket 102. For example, as shown in FIG. 13, FIG. 13 is an equivalent schematic diagram showing that the bracket 102 is deployed to be on a straight line. The limiting structure may include a fixed portion 1041 disposed on the rear housing 1012 and a telescopic portion 1042 that is sleeved in the fixed portion 1041 and is slidable in the fixed portion. A first electromagnetic switch 1031 is closed after receiving the user's instruction, and controls the bracket 102 to rotate. Under an action of a force applied by the bracket 102, the telescopic portion 1042 turns towards the fixed portion 1041 and deforms, so as to retract to be flush with the top face of the limiting recess 1021. When the required sensor rotates to the position of the window, the limiting structure 104 exactly corresponds to the corresponding limiting recess, and at this time, the force applied by the bracket 102 to the limiting structure 104 disappears, so that the telescopic portion 1042 recovers from deformation and extends into the limiting recess 1021, and is matched with the limiting recess to stop the bracket 102 from rotating.

Figure 14A:
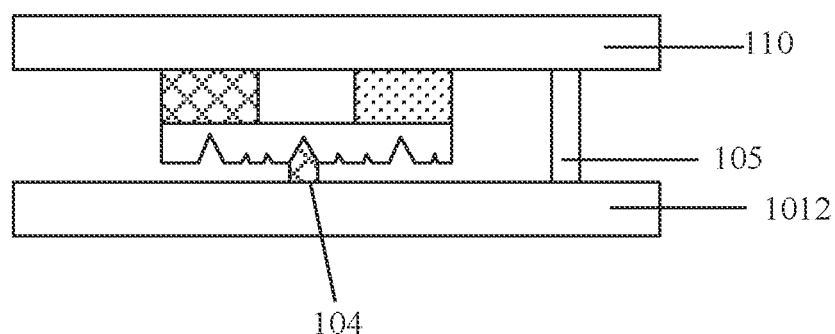
FIGS. 14A and 14B are side views of a display device, in accordance with some embodiments of the present disclosure.
Figure 14B:
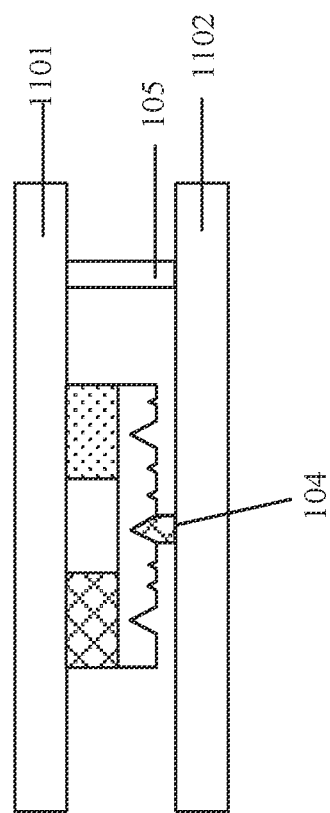

In some embodiments of the present disclosure, as shown in FIG. 14A, FIG. 14A is an equivalent schematic diagram showing that the bracket 102 is deployed to be on a straight line. The display device further includes a supporting structure 105 for supporting the display panel 110 and the housing 101. For example, the supporting structure 105 supports between the display panel 110 and the rear housing 1012, so as to reserve a space for placing the limiting structure 104 and the sensors. In a case where the display panel 110 includes the first display panel and the second display panel, and the second display panel is used to replace the rear housing 1012 of the housing 101, as shown in FIG. 14B, the supporting structure 105 supports between the first display panel and the second display panel.

The forgoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display device, comprising:
a display panel;
a housing configured to support and protect the display panel;
a bracket disposed between the display panel and the housing;
a plurality of sensors fixed on the bracket;
a window located in the display panel or in the housing, and configured to expose at least one of the plurality of sensors; and
a driver configured to control the bracket to rotate in a plane parallel to the display panel, and to control the bracket to stop rotating when a required sensor rotates to a position of the window;
the display device further comprising a limiting structure disposed between the housing and the bracket; wherein
the limiting structure is configured to stop the bracket from rotating when the required sensor rotates to the position of the window.

2. The display device according to claim 1, wherein the driver includes a direct current motor and a driving rotor connected to an output shaft of the direct current motor;
the direct current motor is configured to control the driving rotor to rotate in response to a user's instruction; and
the driving rotor is engaged with the bracket, and the driving rotor is configured to drive the bracket to rotate in the plane parallel to the display panel.

3. The display device according to claim 2, wherein the driving rotor and the bracket are provided with teeth, and the driving rotor and the bracket form a bevel gear; and
the driving rotor is configured to rotate in a plane perpendicular to the display panel, and the bracket is configured to rotate in the plane parallel to the display panel.

4. The display device according to claim 3, wherein the driver further includes a transmission shaft, and a first transmission wheel and a second transmission wheel that are disposed on the transmission shaft; the first transmission wheel is engaged with the driving rotor, and the second transmission wheel is engaged with the bracket, so that a motion output by the direct current motor is transmitted to the bracket through the transmission shaft.

5. The display device according to claim 2, wherein the driving rotor and the bracket are provided with teeth, and the driving rotor and the bracket form a cylindrical gear; and
the driving rotor and the bracket are both configured to rotate in the plane parallel to the display panel.

6. The display device according to claim 2, wherein the driver further includes an electromagnetic switch and an electromagnet connected to the electromagnetic switch; and
the electromagnetic switch is configured to control the electromagnet, in response to a user's instruction, so that the driving rotor is able to move towards the bracket, so as to be engaged with the bracket, and to move away from the bracket, so as to be disengaged from the bracket.

7. The display device according to claim 6, wherein the driving rotor is made of a permanent magnet.

8. The display device according to claim 1, wherein the driver includes an adjusting rod, and the housing includes an opening; and
an end of the adjusting rod is connected to the bracket, and another end of the adjusting rod extends out of the housing through the opening.

9. The display device according to claim 1, wherein the bracket includes at least one limiting recess, and the at least one limiting recess is configured to be matched with the limiting structure to stop the bracket from rotating when the required sensor rotates to the position of the window.

10. The display device according to claim 9, wherein the bracket further includes at least one buffer recess that interacts with the limiting structure; and
a depth of the at least one buffer recess is less than a depth of the at least one limiting recess; or, an attractive force of the at least one buffer recess directly facing the limiting structure is less than an attractive force of the at least one limiting recess directly facing the limiting structure; or, a force of surface friction of the at least one buffer recess is less than a force of surface friction of the at least one limiting recess.

11. The display device according to claim 9, wherein a height of the limiting structure is adjustable in a depth direction of the at least one limiting recess; and
the limiting structure is configured such that when the bracket rotates, an end of the limiting structure proximate to the bracket is retracted to be flush with a surface of the bracket proximate to the limiting structure, and when the bracket stops, the end of the limiting structure proximate to the bracket extends into the at least one limiting recess.

12. The display device according to claim 1, wherein the limiting structure includes at least one projection disposed on the housing.

13. The display device according to claim 1, wherein the display panel includes a first display panel and a second display panel;
a surface of the first display panel facing away from the second display panel is a display surface, a surface of the second display panel facing away from the first display panel is a display surface, and the window is disposed in the first display panel or in the second display panel; and
the housing includes a frame, and the frame supports and protects the first display panel and the second display panel.

14. The display device according to claim 13, further comprising a supporting structure, wherein the supporting structure supports between the first display panel and the second display panel.

15. The display device according to claim 1, wherein the housing includes a frame and a rear housing, the rear housing is arranged opposite to the display panel, and the window is disposed in the rear housing; the plurality of sensors are disposed on a surface of the bracket proximate to the rear housing.

16. The display device according to claim 15, further comprising a supporting structure, wherein the supporting structure supports between the display panel and the rear housing.

17. The display device according to claim 1, wherein the display panel includes a display area and a non-display area, and the window is disposed in the display area, or the window is disposed in the non-display area.

18. The display device according to claim 1, wherein
the window includes a cutout; or
the window includes the cutout and a protective layer that is transparent or translucent and covers the cutout.

19. The display device according to claim 1, wherein the plurality of sensors include at least two of following combination: a camera, a fingerprint sensor, an optical vital sign recognition sensor, a distance sensor, a proximity light sensor or an ambient light sensor.

* * * * *